United States Patent
Bachmann et al.

(10) Patent No.: US 6,869,886 B2
(45) Date of Patent: Mar. 22, 2005

(54) PROCESS FOR ETCHING A METAL LAYER SYSTEM

(75) Inventors: Jens Bachmann, Dresden (DE); Ulrich Baier, Dresden (DE); Falko Höhnsdorf, Dresden (DE)

(73) Assignee: Infineon Technologies AG, Munich (DE)

( * ) Notice: Subject to any disclaimer, the term of this patent is extended or adjusted under 35 U.S.C. 154(b) by 62 days.

(21) Appl. No.: 10/267,335

(22) Filed: Oct. 9, 2002

(65) Prior Publication Data

US 2003/0068899 A1 Apr. 10, 2003

(30) Foreign Application Priority Data

Oct. 9, 2001 (DE) ......................................... 101 49 736

(51) Int. Cl.$^7$ ........................................... H01L 21/461
(52) U.S. Cl. ........................... 438/714; 438/10; 438/17; 438/720; 438/737
(58) Field of Search ............................... 438/714, 9, 10, 438/16, 17, 737, 720; 216/60, 61, 77

(56) References Cited

U.S. PATENT DOCUMENTS

| | | | |
|---|---|---|---|
| 5,849,641 A | 12/1998 | Arnett et al. | |
| 5,904,569 A | * 5/1999 | Kitch | ........................ 438/692 |
| 5,968,711 A | 10/1999 | Lee et al. | |
| 6,025,268 A | 2/2000 | Shen | |
| 6,248,252 B1 | 6/2001 | Nguyen et al. | |

FOREIGN PATENT DOCUMENTS

| | | | |
|---|---|---|---|
| DE | 198 34 917 A1 | | 3/1999 |
| JP | 03-019225 | * | 1/1991 |
| JP | 05-347306 | * | 12/1993 |
| JP | 2001-230255 | * | 8/2001 |

\* cited by examiner

*Primary Examiner*—George A. Goudreau
(74) *Attorney, Agent, or Firm*—Laurence A. Greenberg; Werner H. Stemer; Ralph E. Locher

(57) ABSTRACT

The present invention relates to a process for etching a metal layer system. The metal layer system includes a first aluminum-containing layer, a second aluminum-containing layer, and an interlayer arranged between the two aluminum-containing layers. The interlayer consists of a material that is suitable for end-point detection. The etching process includes a first etching step, in which the upper aluminum-containing layer is etched using a first etching angle, and a second etching step, in which the lower aluminum-containing layer is etched using a second etching angle. The process switches between the first etching step and the second etching step as soon as the end-point detection has detected that the interlayer has been reached. Accordingly, the interlayer is arranged at a location at which it is intended for the process to switch from the first etching step to the second etching step.

8 Claims, 2 Drawing Sheets

Prior Art

PROCESS FOR ETCHING A METAL LAYER SYSTEM

BACKGROUND OF THE INVENTION

Field of the Invention

The present invention relates to a process for etching a metal layer system.

To produce interconnects in integrated circuits, and in particular, in embedded DRAM (dynamic random access memory) cell arrays, which together with larger logic and processing components are integrated on a semiconductor chip, what is known as an AlCu-RIE metalization (AlCu - Reactive Ion Etching metallization) is often used. A metalization of this type is obtained by reactive ion etching a layer stack including an AlCu alloy that has previously been applied to the entire surface.

A cross section through a layer stack of this type is shown in FIG. 3, in which reference numeral 4 denotes a titanium layer that has been deposited on the surface 8 of a semiconductor substrate 12, reference numeral 2 denotes an AlCu alloy layer that has been formed on the titanium layer, reference numeral 6 denotes a titanium layer that has been formed on the AlCu alloy layer, and reference numeral 7 denotes a titanium nitride layer that has been formed on the second titanium layer.

During the etching of metal tracks, it may be highly advantageous to etch using a taper angle, i.e. if the etched walls do not run precisely vertically, but rather are inclined with respect to the metal surface, since in this way the track resistance can be set exactly to the desired value without modifying the lithography. This etching preferably takes place in a two-stage process, in which first of all, in a first stage, the lithography pattern is transferred to the metal with a relatively high etching rate. Therefore, substantially vertical walls are produced in this first stage.

During the second stage, the remainder of the layer stack is etched using a predetermined etching angle as a result of adjusting the ratio of the isotropic chemical to the anisotropic sputtering component in the etching gases. In this context, the etching angle denotes the angle between the horizontal metal surface on the side that is uncovered by etching and the remaining wall. In the case of vertical walls, the etching angle is 90°. If the cross section of the region that has been etched clear increases in the direction toward the semiconductor substrate, the etching angle is less than 90°, while if the cross section of the etched region becomes smaller, the etching angle is greater than 90°.

Since, in a conventional layer stack, the process switches between the first stage and the second stage in the middle of the AlCu alloy layer, the first stage is ended after a preset, fixed time. However, the result of this is that if, for example, different products are being produced using the same technology, with different occupancy densities in the corresponding metalization level, the first etching stage etches into the AlCu alloy layer to very different depths.

For example, if there is a very low occupancy density, with large amounts of material to be etched away, the first etching stage will only etch away a small amount of AlCu alloy in relation to the overall layer thickness, so that most of the metalization layer is etched with an etching angle of greater than 90°. This can lead to short circuits between adjacent interconnects and/or to track resistances that are too low.

If there is a very high occupancy density, in which very little metal will be etched away, on the other hand, the interconnect regions that are not actually supposed to be etched are attacked to such an extent even during the first etching stage that under certain circumstances they may be completely deformed or etched away, leading to excessively high track resistances.

In standard embedded DRAMs, the variation in the occupancy density is approximately 30 to 70%. Hitherto, attempts have been made to solve this problem to some extent by using suitable fill strategies in the layout, but this can still lead to very different occupancy densities in the individual products. In the most unfavorable scenario, a suitable etching process would have to be developed and established for each product.

SUMMARY OF THE INVENTION

It is accordingly an object of the invention to provide a process for etching a metal layer system which overcomes the above-mentioned disadvantages of the prior art processes of this general type.

With the foregoing and other objects in view there is provided, in accordance with the invention, a process for etching a metal layer system that includes steps of: providing a semiconductor wafer including at least an upper aluminum-containing layer, a lower aluminum-containing layer configured below the upper aluminum-containing layer, and an interlayer separating the upper aluminum-containing layer from the lower aluminum-containing layer; performing a first etching step for etching the upper aluminum-containing layer using a first etching angle; performing a second etching step for etching the lower aluminum-containing layer using a second etching angle being different than the first etching angle; and switching from the first etching step to the second etching step as soon as an end-point detection has detected that the interlayer has been reached.

In accordance with an added feature of the invention, the process includes: while performing the first etching step and the second etching step, etching a trench; while performing the first etching step, producing substantially vertical walls of the trench; and while performing the second etching step, producing inclined walls of the trench to reduce a diameter of the trench.

In accordance with an additional feature of the invention, the process includes performing the first etching step with a higher etching rate than when performing the second etching step.

In accordance with another feature of the invention, the process includes: while performing the first etching step and the second etching step, using an etching gas including a mixture of $BCl_3$ and $Cl_2$; while performing the first etching step, using a first proportion of the $BCl_3$ and a second proportion of the $Cl_2$; and while performing the second etching step, using a proportion of the $BCl_3$ that is higher than the first proportion and using a proportion of the $Cl_2$ that is lower than the second proportion.

In accordance with a further feature of the invention, the etching gas also includes $CH_4$ and $N_2$.

In accordance with a further added feature of the invention, the process includes: providing the interlayer with a thickness of 5 to 20 nm; and providing the interlayer either as or with a metal other than aluminum.

In accordance with a further additional feature of the invention, the interlayer at least includes a titanium-containing layer.

In accordance with yet an added feature of the invention, the titanium-containing layer includes a titanium layer or a TiN layer.

The invention is substantially based on configuring an interlayer, which is made from a material that is suitable for end-point detection, in the metalization layer stack that is customarily used. This interlayer is configured at a location at which the process switches from the first etching step to the second etching step.

A material that is suitable for end-point detection has a composition enabling standard end-point detection processes to be used for detecting that the interlayer has been reached during the etching process. In particular, the material includes at least one type of atom that can be detected unambiguously, for example, by analyzing the emission signal. If the occurrence of a corresponding emission line is detected during the etching process, the end point of the first etching step has been reached. In addition to emission spectroscopy, it is also possible for other processes, such as mass spectrometry or the analysis of the plasma parameters, to be used as end-point detection processes. The interlayer at least includes a metal other than aluminum.

In particular, the at least one interlayer may be a titanium-containing layer that provides an unambiguous emission signal. The use of a titanium-containing layer is also advantageous to the extent that titanium-containing layers are present in the upper and lower regions of the metalization layer stacks that are customarily used, and consequently the production process does not require any additional outlay on equipment, such as for example, additional sputtering chambers.

The fact that the at least one interlayer is incorporated in the aluminum-containing alloy layer allows for end-point detection of the first etching step. In this context, the at least one interlayer is arranged at a desired height within the aluminum-containing alloy layer, with the result that it is possible to switch from one etching step to the next at an accurately defined height of the aluminum-containing alloy layer and independently of the metal occupancy density.

The interlayer is usually arranged in the middle third of the metalization layer stack, so that acceptable etching times result for the first etching step and also for the second etching step. If the interlayer is arranged too far toward the top or too far toward the bottom of the metalization layer stack, there is a risk that the end point will not be detected correctly, for example, because titanium-containing layers are also present in the upper and lower regions in the metalization layer stack that is customarily used.

The thickness of the interlayer is approximately 5 to 20 nm. If the layer thicknesses are lower, the end-point detection is difficult to implement, while if the layer thicknesses are greater, the layer stack can become difficult to manage, for example, because a relatively thick interlayer is more difficult to etch.

In the present invention, if the interlayer contains titanium, it is preferable to ensure that $TiAl_3$ is not formed, for example, during a subsequent heat treatment step, which may occur in particular during the deposition of a hard-mask material. The formation of $TiAl_3$ is unfavorable to the extent that $TiAl_3$ can act as an etching stop and can therefore impair the inventive etching process. The formation of $TiAl_3$ is prevented, for example, if TiN is used as the titanium-containing layer or if a layer system with a titanium-containing layer, for example, a titanium layer, which does not directly adjoin the aluminum-containing alloy, is used.

In the inventive process, it is preferable for substantially vertical walls to be produced during the first etching step, whereas the diameter of the etched region is reduced during the second etching step. As a result, the diameter of the interconnects can be set particularly easily by varying the etching-gas mixture during the second etching step. In this context "substantially vertical" walls are walls in which variations in the etching angle are caused by the etching process, but in which the deviation from the upper etched-hole diameter to the lower etched-hole diameter is no more than 10%.

Furthermore, it is preferable for the first etching step to be carried out with a particularly high etching rate, so that the processing time can be shortened.

The detection that the interlayer or interlayer system has been reached can be performed, for example, by analyzing the optical emission signal. As soon as a suitable emission signal is detected, the end point of the first etching step has been reached and the etching process can be switched to the second etching step.

Overall, the present invention provides the following advantages:

The newly inserted interlayer or newly inserted interlayer system makes it possible for the end point of the first etching step of the etching process to be determined accurately and reproducibly.

As a result, the second etching step, in which etching is typically carried out using an etching angle other than 90°, has a well-defined starting point. Consequently, this etching angle etches a well-defined height of the aluminum-containing alloy, which enables better control of the line width and therefore of the resistance of the interconnect.

The etching process can therefore more readily be transferred to products with different occupancy densities or even etching rates.

A particular advantage results from the fact that the inventive etching process can very easily be adapted to etching chambers with different etching rates. Usually, different etching chambers or etching chambers of different processing installations (tools) have different etching rates. The fact that the first etching step no longer takes place with time control, but rather with end-point control, eliminates the need for labor-intensive calibration of new etching chambers or tools. Furthermore, reproducible results are in each case achieved during etching in different etching chambers or tools.

The introduction of an additional titanium-containing interlayer increases the resistance to electromigration, with the result that the reliability of the metalization is improved.

Other features which are considered as characteristic for the invention are set forth in the appended claims.

Although the invention is illustrated and described herein as embodied in a process for etching a metal layer system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
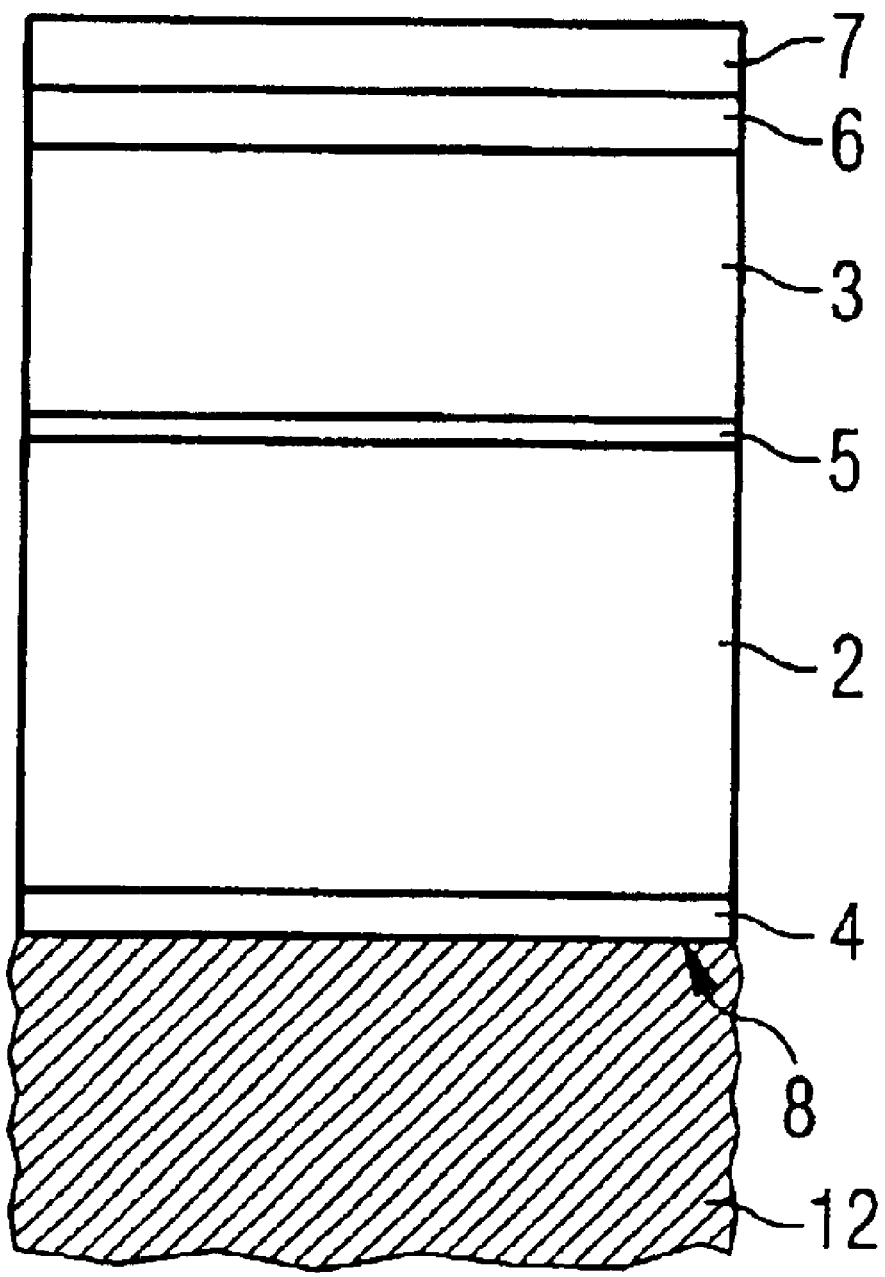
FIG. 1 shows an inventive metal layer system.

Referring now to the figures of the drawing in detail and first, particularly, to FIG. 1 thereof, there is shown a thin titanium layer 4 that has been deposited, in a thickness of approximately 10 nm, on a surface 8 of a semiconductor substrate 12 by a generally known process, such as for example, sputtering. Then, an aluminum-copper alloy, typically with a copper content of 0.5%, is deposited as a metalization layer 2, likewise by using a sputtering process. To produce an interlayer of titanium, an approximately 5 to 10 nm thick titanium layer 5 is applied, likewise by sputtering.

Then, a second AlCu alloy layer 3 is applied. The metalization stack is completed by first depositing a thin titanium layer 6, typically with a thickness of approximately 20 nm, and then depositing a slightly thicker titanium nitride layer 7, typically with a thickness of approximately 100 nm, once again by sputtering. The titanium-containing layers are applied in the same tool, but in a different sputtering chamber than the aluminum-containing layers.

One object of the titanium nitride layer 7 is to form a metallurgical barrier between silicon and aluminum. The titanium layer 4 forms a low-resistance $TiSi_2$ contact layer with the silicon of the substrate surface 8.

By contrast, the thin titanium layer 5 is used for end-point detection of the first etching step in the process for etching the interconnects 1 that is described below. For this reason, it is arranged at the location at which the process is to switch from the first etching step to the second etching step.

The metal layer system that has just been produced usually has a thickness of 300 to 450 nm (nanometers).

To etch the interconnects 1, the metal layer system which has just been produced is first of all covered with a hardmask material that is approximately 100 to 300 nm thick and that includes $SiO_2$, SiON or a combination thereof, and is covered with a photoresist material. The photoresist material is patterned by photolithography using a mask in accordance with the interconnects that will be produced. Then, first of all, the hard mask is etched in a plasma etching process using $CF_4/CHF_3$ as an etching gas. After the remaining photoresist material has been removed, the inventive process for etching the metal layer system is carried out.

Figure 2:
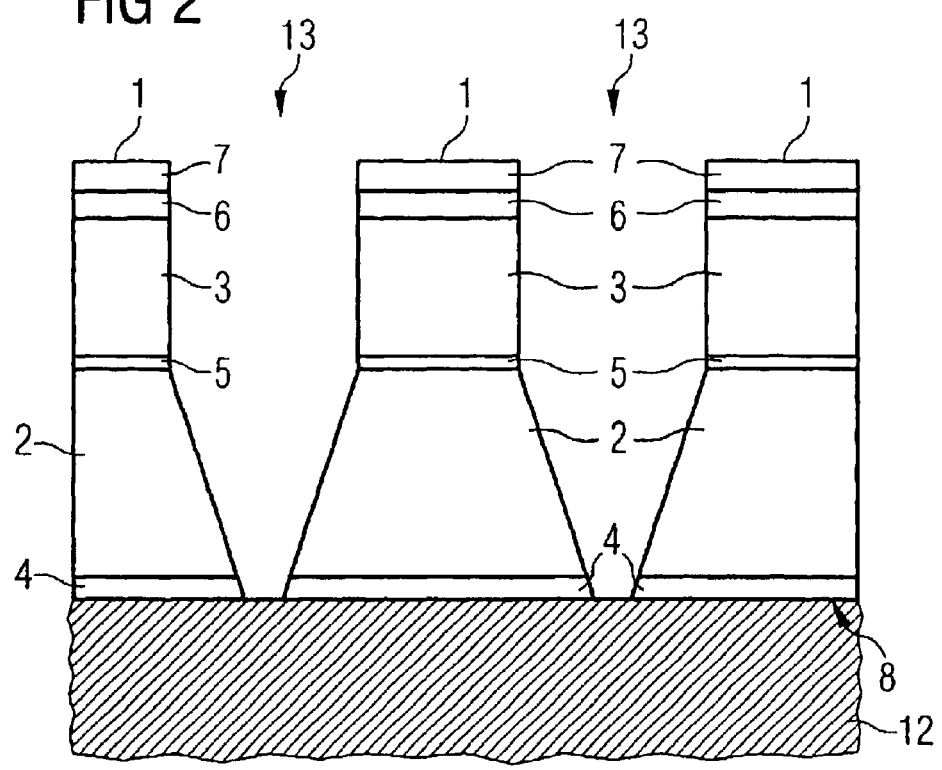
FIG. 2 shows the metal layer system after etching interconnects.
Figure 3:
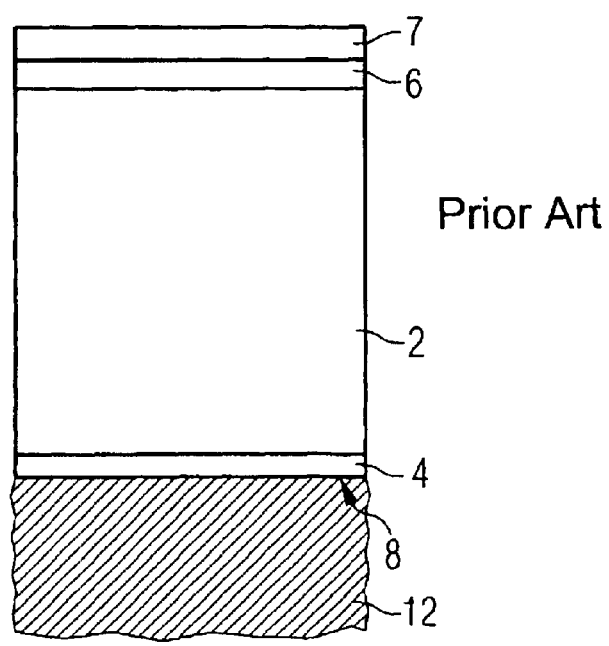
FIG. 3 shows a conventional metal layer system.

First of all, the upper aluminum-containing layer 3 is etched by a reactive ion etching process using an etching gas mixture including $BCl_3$, $Cl_2$, $CH_4$ and $N_2$, with substantially vertical walls. As soon as emission spectroscopy has detected that the titanium layer 5 has been reached, the etching process is switched such that the mixture ratio of the components of the etching-gas mixture is changed while the components of the etching-gas mixture remains unchanged. By way of example, during the second etching step the proportion of $BCl_3$ is increased while the proportion of $Cl_2$ is reduced. The result, as illustrated in FIG. 2, is a reduction in the cross section of the etched trenches 13. Since the first etching step is not ended after a predetermined fixed time, but rather is ended after detecting the end point, the second etching step starts at the height of the remaining metalization stack that is defined by the titanium layer. As a result, a predetermined interconnect width, and therefore also a predetermined interconnect resistance is achieved.

As soon as the titanium layer 4 has been etched, the process is ended and the metalization structure is processed further using standard processes. The resulting metalization structure illustrated in FIG. 2 is used to wire functional elements in a semiconductor chip, which may in particular be a chip with an embedded DRAM.

We claim:

1. A process for etching a metal layer system, the process which comprises:

providing a semiconductor wafer including at least an upper aluminum-containing layer, a lower aluminum-containing layer configured below the upper aluminum-containing layer, and an interlayer separating the upper aluminum-containing layer from the lower aluminum-containing layer;

performing a first etching step for etching the upper aluminum-containing layer using a first etching angle;

performing a second etching step for etching the lower aluminum-containing layer using a second etching angle being different than the first etching angle; and switching from the first etching step to the second etching step as soon as an end-point detection has detected that the interlayer has been reached.

2. The process according to claim 1, which comprises:

while performing the first etching step and the second etching step, etching a trench;

while performing the first etching step, producing substantially vertical walls of the trench; and while performing the second etching step, producing inclined walls of the trench to reduce a diameter of the trench.

3. The process according to claim 1, which comprises: performing the first etching step with a higher etching rate than when performing the second etching step.

4. The process according to claim 1, which comprises:

while performing the first etching step and the second etching step, using an etching gas including a mixture of $BCl_3$ and $Cl_2$;

while performing the first etching step, using a first proportion of the $BCl_3$ and a second proportion of the $Cl_2$; and while performing the second etching step, using a proportion of the $BCl_3$ that is higher than the first proportion and using a proportion of the $Cl_2$ that is lower than the second proportion.

5. The process according to claim 4, wherein: the etching gas also includes $CH_4$ and $N_2$.

6. The process according to claim 1, which comprises: providing the interlayer with a thickness of 5 to 20 nm; and providing the interlayer with a metal other than aluminum.

7. The process according to claim 1, wherein: the interlayer at least includes a titanium-containing layer.

8. The process as claimed in claim 7, wherein: the titanium-containing layer includes a layer selected from a group consisting of a titanium layer and a TiN layer.

* * * * *